US012120936B2

(12) United States Patent
Yun et al.

(10) Patent No.: US 12,120,936 B2
(45) Date of Patent: Oct. 15, 2024

(54) ORGANIC LIGHT-EMITTING DISPLAY APPARATUS AND METHOD OF MANUFACTURING THE SAME

(71) Applicant: SAMSUNG DISPLAY CO., LTD., Yongin-si (KR)

(72) Inventors: Wonmin Yun, Yongin-si (KR); Yisu Kim, Yongin-si (KR); Eungseok Park, Yongin-si (KR); Byoungduk Lee, Yongin-si (KR); Yunah Chung, Yongin-si (KR); Yoonhyeung Cho, Yongin-si (KR); Yongchan Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/342,644

(22) Filed: Jun. 27, 2023

(65) Prior Publication Data

US 2023/0345792 A1    Oct. 26, 2023

Related U.S. Application Data

(63) Continuation of application No. 17/751,064, filed on May 23, 2022, now Pat. No. 11,737,336, which is a
(Continued)

(30) Foreign Application Priority Data

Dec. 28, 2015  (KR) .......................... 10-2015-0187639

(51) Int. Cl.
*H10K 59/38* (2023.01)
*H10K 50/844* (2023.01)
*H10K 102/00* (2023.01)

(52) U.S. Cl.
CPC .......... *H10K 59/38* (2023.02); *H10K 50/844* (2023.02); *H10K 2102/331* (2023.02)

(58) Field of Classification Search
CPC ..................................................... H10K 59/38
(Continued)

(56) References Cited

U.S. PATENT DOCUMENTS 6,608,439 B1   8/2003  Sokolik et al.
7,893,607 B2   2/2011  Terakado et al.
(Continued)

FOREIGN PATENT DOCUMENTS

CN    1722925 A    1/2006
CN    1797781 A    7/2006
(Continued)

OTHER PUBLICATIONS

U.S. Office Action dated Feb. 21, 2020, issued in U.S. Appl. No. 16/520,175 (18 pages).

*Primary Examiner* — Ajay Arora
(74) *Attorney, Agent, or Firm* — Lewis Roca Rothgerber Christie LLP

(57) ABSTRACT

An organic light-emitting display apparatus includes a substrate; a pixel electrode over the substrate; a pixel-defining layer including an opening that exposes at least a portion of the pixel electrode; an intermediate layer, which is over the portion of the pixel electrode exposed by the opening and includes an organic emission layer; a counter electrode over the intermediate layer; and an encapsulating structure, which is over the counter electrode and includes at least one inorganic layer and at least one organic layer, and the at least one organic layer includes quantum dots and is in the opening.

20 Claims, 10 Drawing Sheets

Related U.S. Application Data continuation of application No. 17/103,076, filed on Nov. 24, 2020, now Pat. No. 11,342,388, which is a continuation of application No. 15/203,735, filed on Jul. 6, 2016, now Pat. No. 10,879,317.

(58) Field of Classification Search
USPC .......................................................... 257/40
See application file for complete search history.

(56) References Cited

U.S. PATENT DOCUMENTS

| | | | |
|---|---|---|---|
| 7,898,167 B2 | 3/2011 | Song et al. | |
| 8,129,898 B2 | 3/2012 | Choi et al. | |
| 8,294,168 B2 | 10/2012 | Park et al. | |
| 8,952,360 B2* | 2/2015 | Oh | H10K 50/8445 |
| | | | 257/40 |
| 9,111,464 B2 | 8/2015 | Bibl et al. | |
| 9,515,285 B2 | 12/2016 | Sato | |
| 9,548,009 B2 | 1/2017 | Pickett et al. | |
| 9,836,699 B1 | 12/2017 | Rigetti et al. | |
| 2006/0125389 A1 | 6/2006 | Song et al. | |
| 2009/0021148 A1 | 1/2009 | Hachiya et al. | |
| 2009/0091258 A1 | 4/2009 | Heuser et al. | |
| 2009/0091689 A1 | 4/2009 | Rho et al. | |
| 2010/0140585 A1 | 6/2010 | Bawendi et al. | |
| 2013/0168712 A1 | 7/2013 | Jeong et al. | |
| 2014/0049826 A1 | 2/2014 | Lee et al. | |
| 2014/0062292 A1 | 3/2014 | Seong | |
| 2014/0339495 A1 | 11/2014 | Bibl et al. | |
| 2015/0255690 A1 | 9/2015 | Vo et al. | |
| 2015/0260373 A1 | 9/2015 | Li et al. | |
| 2016/0274284 A1 | 9/2016 | Ishikawa | |
| 2019/0319075 A1* | 10/2019 | Lee | H10K 50/86 |

FOREIGN PATENT DOCUMENTS

| | | |
|---|---|---|
| CN | 101176385 A | 5/2008 |
| CN | 101577289 A | 11/2009 |
| CN | 102330914 A | 1/2012 |
| CN | 103178078 A | 6/2013 |
| CN | 104838437 A | 8/2015 |
| CN | 105097870 A | 11/2015 |
| JP | 2006-32010 A | 2/2006 |
| JP | 2009-87752 A | 4/2009 |
| JP | 2011-60780 A | 3/2011 |
| JP | 2015-220069 A | 12/2015 |
| JP | 2016-42449 | 3/2016 |
| KR | 10-2008-0007247 A | 1/2008 |
| KR | 10-2008-0041780 | 5/2008 |
| KR | 10-2009-0036373 | 4/2009 |
| KR | 10-2009-0116199 A | 11/2009 |
| KR | 10-2011-0133398 | 12/2011 |
| KR | 10-2013-0076401 | 7/2013 |
| KR | 10-2015-0062379 | 6/2015 |
| KR | 10-1555954 | 9/2015 |
| TW | 201515260 A | 4/2015 |
| WO | WO 2006/120895 A1 | 11/2006 |

\* cited by examiner

ORGANIC LIGHT-EMITTING DISPLAY APPARATUS AND METHOD OF MANUFACTURING THE SAME

CROSS-REFERENCE TO RELATED APPLICATIONS

This application is a continuation of U.S. patent application Ser. No. 17/751,064, filed on May 23, 2022, which is a continuation of U.S. patent application Ser. No. 17/103,076, filed on Nov. 24, 2020, now U.S. Pat. No. 11,342,388, which is a continuation of U.S. patent application Ser. No. 15/203,735, filed on Jul. 6, 2016, now U.S. Pat. No. 10,879,317, which claims priority to and the benefit of Korean Patent Application No. 10-2015-0187639, filed on Dec. 28, 2015 in the Korean Intellectual Property Office, the entire disclosures of all of which are incorporated herein by reference.

BACKGROUND

1. Field

Aspects of one or more embodiments relate to an organic light-emitting display apparatus and a method of manufacturing the same, and more particularly, to an organic light-emitting display apparatus including quantum dots and a method of manufacturing the same.

2. Description of the Related Art

An organic light-emitting display apparatus is a self-luminescent display apparatus that includes a hole injection electrode, an electron injection electrode, and an organic emission layer therebetween and emits light as excitons, which are generated as holes injected by the hole injection electrode and electrons injected by the electron injection electrode combine in the organic emission layer, and transition from an excited state to a ground state.

Since an organic light-emitting display apparatus, which is a self-luminescent display apparatus, does not require a separate light source, the organic light-emitting display apparatus may be driven with a low voltage and may be configured into a lightweight and slim apparatus. Furthermore, due to excellent properties including a viewing angle, contrast, and a response speed, an organic light-emitting display apparatus is widely applied to portable apparatuses, such as an MP3 player or a mobile phone, a television (TV), etc.

Recently, for reduced thickness and/or flexibility of an organic light-emitting display apparatus, a thin-film encapsulation (TFE) including at least one inorganic layer and at least one organic layer is employed to seal an organic light-emitting device.

SUMMARY

According to an aspect of one or more embodiments, an organic light-emitting display apparatus has enhanced color purity that may be easily manufactured as a flexible display apparatus.

Additional aspects will be set forth in part in the description which follows and, in part, will be apparent from the description, or may be learned by practice of the presented embodiments.

According to one or more embodiments, an organic light-emitting display apparatus includes a substrate; a pixel electrode over the substrate; a pixel-defining layer including an opening that exposes at least a portion of the pixel electrode; an intermediate layer, which is over the portion of the pixel electrode exposed by the opening and includes an organic emission layer; a counter electrode over the intermediate layer; and an encapsulating structure, which is over the counter electrode and includes at least one inorganic layer and at least one organic layer, and the at least one organic layer includes quantum dots and is in the opening.

The thickness of the at least one organic layer including the quantum dots may be less than or equal to about 20 μm.

According to an embodiment, the at least one inorganic layer may have a thickness less than or equal to about 5 μm and may include at least one of silicon nitride ($SiN_x$), silicon oxide ($SiO_2$), silicon oxynitride ($SiO_xN_y$) or aluminum oxide ($Al_2O_3$).

According to an embodiment, the pixel electrode may be a reflective electrode that reflects light, and the counter electrode may be a transparent or semi-transparent electrode that at least partially transmits light therethrough.

According to an embodiment, the organic emission layer may emit blue light.

According to an embodiment, the quantum dots may absorb at least a part of the blue light and emit yellow light, and at least a part of the blue light may be transmitted through the organic layer including the quantum dots.

According to an embodiment, the at least one inorganic layer may include a first inorganic layer over the counter electrode and a second inorganic layer over the first inorganic layer, and the at least one organic layer including the quantum dots may include a lower organic layer between the first inorganic layer and the second inorganic layer.

According to an embodiment, the second inorganic layer may include a first area directly contacting the first inorganic layer, and a second area that is spaced apart from the first inorganic layer by the lower organic layer.

According to an embodiment, the at least one organic layer including the quantum dots may further include an upper organic layer over the second inorganic layer, and the at least one inorganic layer may further include a third inorganic layer over the upper organic layer.

According to an embodiment, the pixel electrode may include a first pixel electrode, a second pixel electrode, and a third pixel electrode that are apart from one another, the pixel-defining layer may include a first opening, a second opening, and a third opening that expose at least portions of the first pixel electrode, the second pixel electrode, and the third pixel electrode, respectively, and the intermediate layer may include a first intermediate layer over the first pixel electrode, a second intermediate layer over the second pixel electrode, and a third intermediate layer over the third pixel electrode.

According to an embodiment, the at least one organic layer including the quantum dots may include a first organic layer that is in the first opening and includes first quantum dots of the quantum dots, a second organic layer that is in the second opening and includes second quantum dots of the quantum dots, and a third organic layer that is in the third opening and includes third quantum dots of the quantum dots.

According to an embodiment, the first intermediate layer, the second intermediate layer, and the third intermediate layer may emit red light, green light, and blue light, respectively, and the first quantum dots, the second quantum dots, and the third quantum dots may be red quantum dots, green quantum dots, and blue quantum dots, respectively.

According to an embodiment, all of the first intermediate layer, the second intermediate layer, and the third intermediate layer may emit white light, and the first quantum dots, the second quantum dots, and the third quantum dots may be red quantum dots, green quantum dots, and blue quantum dots, respectively.

According to an embodiment, the first organic layer, the second organic layer, and the third organic layer may be separated from one another by the pixel-defining layer.

According to one or more embodiments, a method of manufacturing an organic light-emitting display apparatus includes forming a pixel electrode disposed over a substrate; forming a pixel-defining layer including an opening that exposes at least a portion of the pixel electrode over the pixel electrode; forming an intermediate layer, which includes an organic emission layer, over the portion of the pixel electrode exposed by the opening; forming a counter electrode over the intermediate layer; and forming an encapsulating structure, which includes at least one inorganic layer and at least one organic layer over the counter electrode, wherein the organic layer includes quantum dots and is in the opening.

According to an embodiment, the thickness of the at least one organic layer including the quantum dots may be less than or equal to about 20 μm.

According to an embodiment, the at least one inorganic layer may have a thickness less than or equal to about 5 μm and may include at least one of silicon nitride ($SiN_x$), silicon oxide ($SiO_2$), silicon oxynitride ($SiO_xN_y$), and aluminum oxide ($Al_2O_3$).

According to an embodiment, the forming of the encapsulating structure may include forming a first inorganic layer of the at least one inorganic layer over the counter electrode; forming an organic layer of the at least one organic layer including the quantum dots over the first inorganic layer; and forming a second inorganic layer of the at least one inorganic layer over the organic layer.

According to an embodiment, the forming of the organic layer may include forming an organic material having dispersed therein the quantum dots in the opening included in the pixel-defining layer via inkjet-printing; and curing the organic material having dispersed therein the quantum dots.

According to an embodiment, the forming of the second inorganic layer may include forming the second inorganic layer to include a first area directly contacting the first inorganic layer, and a second area that is spaced apart from the first inorganic layer by the organic layer including the quantum dots.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
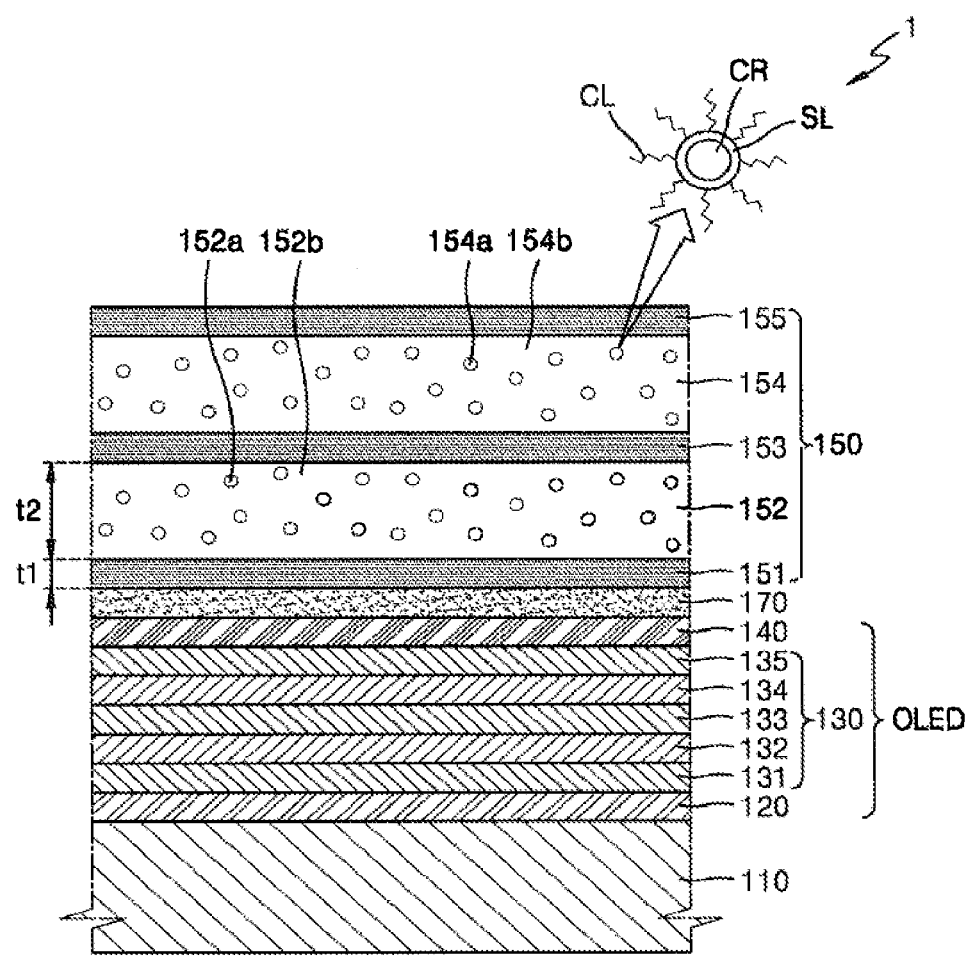
FIG. 1 is a schematic sectional view of an organic light-emitting display apparatus according to an embodiment.

As the inventive concept allows for various changes and numerous embodiments, some particular embodiments will be illustrated in the drawings and described in further detail in the following description. However, this is not intended to limit the inventive concept to particular modes of practice, and it is to be appreciated that all changes, equivalents, and substitutes that do not depart from the spirit and technical scope of the inventive concept are encompassed in the inventive concept. In the description of the inventive concept, certain detailed explanations of the related art are omitted when it is deemed that they may unnecessarily obscure the essence of the inventive concept.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings may be arbitrarily illustrated for convenience of explanation, the following embodiments are not limited thereto.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of" when preceding a list of elements, modify the entire list of elements, and do not modify the individual elements of the list.

FIG. 1 is a schematic sectional view of an organic light-emitting display apparatus 1 according to an embodiment.

Referring to FIG. 1, the organic light-emitting display apparatus 1 according to an embodiment includes a flexible substrate 110, a pixel electrode 120 disposed over the flexible substrate 110, an intermediate layer 130, which is disposed over the pixel electrode 120 and includes an organic emission layer 133, a counter electrode 140 disposed over the intermediate layer 130, and an encapsulating structure 150, which is disposed over the counter electrode 140 and includes at least one inorganic layer 151, 153, 155 and at least one organic layer 152, 154 including quantum dots 152a and 154a.

The flexible substrate 110 may include various materials, such as glass, a metal, or plastic. Here, the flexible substrate 110 may refer to a substrate that may be easily bent, curved, folded, or rolled. The flexible substrate 110 may include ultra-thin glass, a metal, or plastic. For example, if the flexible substrate 110 includes plastic, the flexible substrate 110 may include polyimide (PI), but is not limited thereto.

An organic light-emitting device OLED is disposed over the flexible substrate 110, where the organic light-emitting device OLED may include the pixel electrode 120, the intermediate layer 130, and the counter electrode 140.

The pixel electrode 120 may be a reflective electrode including a reflective layer. According to an embodiment, the reflective layer may include at least one of silver (Ag), magnesium (Mg), aluminum (Al), platinum (Pt), palladium (Pd), gold (Au), nickel (Ni), neodymium (Nd), iridium (Ir), and chromium (Cr), where a transparent or semi-transparent electrode layer including at least one selected from a group consisting of indium tin oxide (ITO), indium zinc oxide (IZO), zinc oxide (ZnO), indium oxide ($In_2O_3$), indium gallium oxide (IGO), and aluminum zinc oxide (AZO) may be further disposed over the reflective layer. For example, the pixel electrode 120 may include three layers of ITO/Ag/ITO.

The counter electrode 140 may include various conductive materials and may be a transparent or semi-transparent electrode. According to an embodiment, the counter electrode 140 may include one or more materials selected from among silver (Ag), aluminum (Al), ytterbium (Yb), titanium (Ti), magnesium (Mg), nickel (Ni), lithium (Li), calcium (Ca), copper (Cu), LiF/Ga, LiF/Al, MgAg, and CaAg, where the counter electrode 140 may include a thin film having a thickness from several nm to dozens of nm by using one or more of the above-stated materials to transmit light therethrough.

The organic light-emitting display apparatus 1 according to an embodiment may be a top-emission type display apparatus in which light is emitted from the intermediate layer 130 toward the encapsulating structure 150.

The intermediate layer 130 includes the organic emission layer 133 and may further include a common layer. According to an embodiment, the common layer may include a hole injection layer 131 and a hole transport layer 132 between the pixel electrode 120 and the organic emission layer 133 and may include an electron transport layer 134 and an electron injection layer 135 between the organic emission layer 133 and the counter electrode 140.

However, the inventive concept is not limited thereto. The intermediate layer 130 may not include at least some of the above-stated common layers or may further include function layers other than the above-stated common layers.

According to an embodiment, the organic light-emitting device OLED may emit red light, green light, or blue light according to the type of the organic emission layer 133. However, the inventive concept is not limited thereto, and the organic light-emitting device OLED may emit other light colors or white light.

In the case the organic light-emitting device OLED emits white light, the organic emission layer 133 included in the organic light-emitting device OLED may have a structure in which different types of organic emission layers are stacked or may be a layer including a combination of different organic materials.

The encapsulating structure 150 may be disposed over the organic light-emitting device OLED, where the encapsulating structure 150 may include at least one inorganic layer 151, 153, 155 and at least one organic layer 152, 154. According to an embodiment, the encapsulating structure 150 may include a first inorganic layer 151 disposed over the counter electrode 140, a lower organic layer 152, which is disposed over the first inorganic layer 151 and includes quantum dots 152a, and a second inorganic layer 153 disposed over the lower organic layer 152. In other words, the lower organic layer 152 may be between the first inorganic layer 151 and the second inorganic layer 153. An upper organic layer 154 including quantum dots 154a may be disposed over the second inorganic layer 153, and a third inorganic layer 155 may be further disposed over the upper organic layer 154.

Although FIG. 1 shows a case in which the three inorganic layers 151, 153, and 155 and the two organic layers 152 and 154 are disposed, the inventive concept is not limited thereto.

The encapsulating structure 150 seals the organic light-emitting device OLED to prevent or substantially prevent the organic light-emitting device OLED from being exposed to the outside atmosphere or impurities. Since the encapsulating structure 150 has a very small thickness, the encapsulating structure 150 may be used as an encapsulating structure in a bendable or foldable flexible display apparatus.

A function layer 170 that enhances characteristics emitted by the organic light-emitting device OLED may be further disposed between the counter electrode 140 and the encapsulating structure 150, where the function layer 170 may include a capping layer and a cover layer that protects the organic light-emitting device OLED from possible damage during an operation using plasma, for example. According to an embodiment, the capping layer may include an organic material, whereas the cover layer may include LiF.

According to an embodiment, the inorganic layers 151, 153, and 155 may include silicon nitride ($SiN_x$), silicon oxide ($SiO_2$), silicon oxynitride ($SiO_xN_y$) or aluminum oxide ($Al_2O_3$) and may block or reduce permeation of impurities, such as moisture or oxygen, to the organic light-emitting device OLED.

The organic layers 152 and 154 may include organic materials 152b and 154b and the quantum dots 152a and 154a that are respectively dispersed in the organic materials 152b and 154b. The organic layers 152 and 154 may be used together with the inorganic layers 151, 153, and 155 to improve sealing characteristics of the encapsulating structure 150 and to planarize rough surfaces therebelow. The organic materials 152b and 154b may include various organic materials, such as epoxy-based resins, acryl-based resins, or polyimide-based resins, and may be inkjet-printable materials.

According to an embodiment, a thickness t1 of each of the inorganic layers 151, 153, and 155 may be less than or equal to about 5 μm, whereas a thickness t2 of each of the organic layers 152 and 154 may be less than or equal to about 20 μm. If the thickness t1 of each of the inorganic layers 151, 153, and 155 exceeds about 5 μm or the thickness t2 of each of the organic layers 152 and 154 exceeds about 20 μm, it may be difficult to reduce the thickness of the organic light-emitting display apparatus 1 and/or to manufacture the organic light-emitting display apparatus 1 as a flexible display apparatus.

Furthermore, the thickness t1 of each of the inorganic layers 151, 153, and 155 may be greater than about 300 nm, whereas the thickness t2 of each of the organic layers 152 and 154 may be greater than about 1 μm. If the thickness t1 of each of the inorganic layers 151, 153, and 155 is less than or equal to about 300 nm, it may be difficult to block permeation of moisture or oxygen to the organic light-emitting device OLED. If the thickness t2 of each of the organic layers 152 and 154 is less than or equal to about 1

μm, it may be difficult to uniformly disperse the quantum dots 152a and 154a having sizes from several nm to hundreds of nm.

The quantum dots 152a and 154a are respectively dispersed in the organic materials 152b and 154b. A quantum dot refers to a spherical semiconductor nano-material having a size from several nm to hundreds of nm and may include a core CR including a material having a small band gap and a shell SL that surrounds the core CR. Unlike a material in a bulk state, a quantum dot has discontinuous band gap energy due to the quantum confinement effect. Therefore, a quantum dot may absorb light of a certain wavelength and emit light of a wavelength longer than that of the absorbed light, where the emitted light may have very high color purity with a small full width at half maximum (FWHM). The quantum dot may further include a capping ligand CL for preventing quantum dots from being massed with one another and improving solubility.

According to an embodiment, the core CR may include a group II-VI semiconductor, a group III-V semiconductor, a group I-III-VI semiconductor, or a group VI-IV semiconductor and may include one of CdSe, CdTe, CdS, ZnSe, ZnO, ZnTe, InP, InAs, GaP, $GaInP_2$, PbS, TiO, AgI, AgBr, PbSe, $In_2S_3$, $In_2Se_3$, $Cd_3P_2$, $Cd_3As_2$, InGaN, and InN.

Intervals between energy bands vary depending on sizes of the quantum dots. Therefore, if same quantum dots with different sizes are used, light of different wavelengths may be emitted. An energy band gap of a quantum dot increases as the size of the quantum dot decreases, and thus the wavelength of light emitted thereby decreases.

The quantum dots 152a and 154a included in the organic layers 152 and 154 may absorb light of a certain wavelength and emit light of a wavelength longer than that of the absorbed light. According to an embodiment, the quantum dots 152a and 154a may be red quantum dots that emit red light, green quantum dots that emit green light, blue quantum dots that emit blue light, or yellow quantum dots that emit yellow light.

According to an embodiment, the organic light-emitting device OLED may emit blue light, and the quantum dots 152a and 154a included in the organic layers 152 and 154 of the encapsulating structure 150 may be yellow quantum dots that absorb blue light and emit yellow light. According to another embodiment, the quantum dots 152a and 154a may be a combination of red quantum dots that absorb blue light and emit red light and green quantum dots that emit green light. In this case, yellow light may be emitted as a combination of red light and green light.

According to another embodiment, the quantum dots 152a included in the single organic layer 152 may be red quantum dots, whereas the quantum dots 154a included in the other organic layer 154 may be green quantum dots.

A part of blue light emitted by the organic light-emitting device OLED may not be absorbed by the encapsulating structure 150 and may be transmitted therethrough, whereas the other part of the blue light may be absorbed by the quantum dots 152a and 154a included in the encapsulating structure 150 and transformed to yellow light. As a result, the organic light-emitting display apparatus 1 may emit white light as a combination of the blue light and the yellow light.

Figure 2:
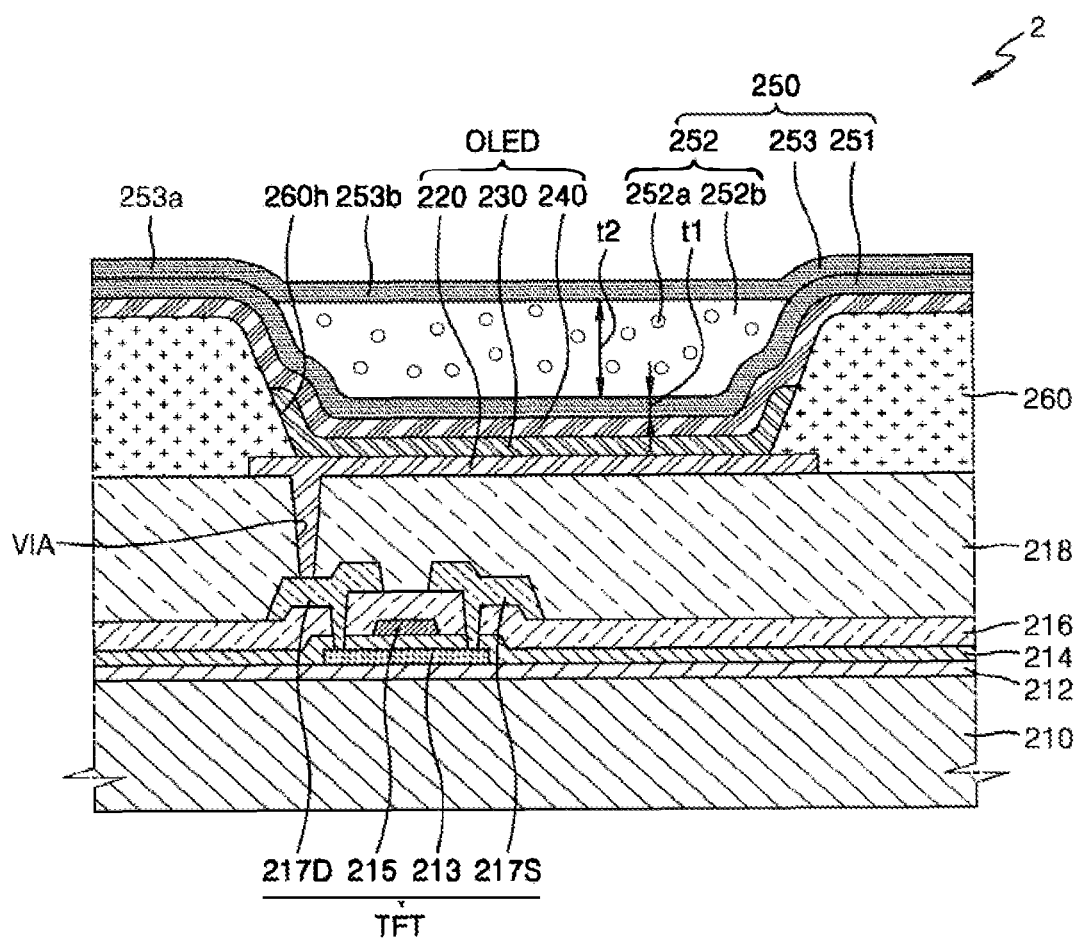
FIG. 2 is a schematic sectional view of an organic light-emitting display apparatus according to another embodiment.

FIG. 2 is a schematic sectional view of an organic light-emitting display apparatus 2 according to another embodiment. Descriptions below of the organic light-emitting display apparatus 2 according to another embodiment will focus on differences between the organic light-emitting display apparatus 2 of FIG. 2 and the organic light-emitting display apparatus 1 previously described.

Referring to FIG. 2, the organic light-emitting display apparatus 2 according to an embodiment may include a substrate 210, a pixel electrode 220 disposed over the substrate 210, a pixel-defining layer 260 including an opening 260h that exposes at least a portion of the pixel electrode 220, an intermediate layer 230, which is disposed on the portion of pixel electrode 220 exposed by the opening 260h and includes an organic emission layer, a counter electrode 240 disposed over the intermediate layer 230, and an encapsulating structure 250, which is disposed over the counter electrode 240 and includes at least one inorganic layer 251 or 253 and at least one organic layer 252 including quantum dots 252a.

A pixel circuit that drives an organic light-emitting device OLED and includes at least one thin-film transistor (TFT) may be between the substrate 210 and the organic light-emitting device OLED.

The TFT may include an active layer 213 disposed over the substrate 210, a gate electrode 215 disposed over at least a portion of the active layer 213, and a source electrode 217S and a drain electrode 217D that are disposed over the gate electrode 215 and are electrically connected to the active layer 213.

A buffer layer 212 may be between the substrate 210 and the active layer 213, a first insulation layer 214 may be between the active layer 213 and the gate electrode 215, and a second insulation layer 216 may be disposed over the gate electrode 215.

A third insulation layer 218 may be disposed over the second insulation layer 216 and covers the source electrode 217S and the drain electrode 217D, and the third insulation layer 218 may include a via hole VIA that exposes at least a portion of the drain electrode 217D. The TFT may be electrically connected to the pixel electrode 220 via the via hole VIA.

According to an embodiment, the pixel electrode 220 may be a reflective electrode, the counter electrode 240 may be a transparent or semi-transparent electrode, and light emitted by the organic emission layer included in the intermediate layer 230 may be transmitted through the counter electrode 240 and emitted from the organic light-emitting display apparatus 2. In other words, the organic light-emitting display apparatus 2 may be a top-emission type display apparatus.

According to an embodiment, the TFT may overlap the pixel electrode 220 in a plan view. In other words, when viewed in a direction perpendicular to the main surfaces of the substrate 210, the pixel electrode 220 and the TFT may at least partially overlap each other.

In the top-emission type organic light-emitting display apparatus 2, since at least a portion of the pixel circuit is between the substrate 210 and the pixel electrode 220, it is not necessary to secure a separate space for arranging the pixel circuit, and thus an aperture ratio of the organic light-emitting display apparatus 2 may be increased.

The intermediate layer 230 includes an organic emission layer and may further include a hole injection layer, a hole transport layer, an electron transport layer, and/or an electron injection layer. According to an embodiment, the intermediate layer 230 includes an organic emission layer, and the organic light-emitting device OLED may emit red light, green light, or blue light according to the type of the organic emission layer. However, the inventive concept is not limited thereto, and the organic light-emitting device OLED may emit other light colors or white light.

The encapsulating structure 250 may be disposed over the organic light-emitting device OLED, where the encapsulating structure 250 may include at least one inorganic layer 251, 253 and at least one organic layer 252. According to an embodiment, the encapsulating structure 250 may include a first inorganic layer 251 disposed over the counter electrode 240, a lower organic layer 252, which is disposed over the first inorganic layer 251 and includes quantum dots 252a, and a second inorganic layer 253 disposed over the lower organic layer 252. Although FIG. 2 shows a case in which two inorganic layers 251 and 253 and one lower organic layer 252 are disposed, the inventive concept is not limited thereto.

According to an embodiment, the inorganic layers 251 and 253 may include silicon nitride ($SiN_x$), silicon oxide ($SiO_2$), silicon oxynitride ($SiO_xN_y$) or aluminum oxide ($Al_2O_3$) and may block or reduce permeation of impurities, such as moisture or oxygen, to the organic light-emitting device OLED.

The lower organic layer 252 may include an organic material 252b and the quantum dots 252a that are dispersed in the organic material 252b. The lower organic layer 252 may be used together with the inorganic layers 251 and 253 to improve sealing characteristics of the encapsulating structure 250 and to planarize rough surfaces therebelow. The organic material 252b may include various organic materials, such as epoxy-based resins, acryl-based resins, or polyimide-based resins, and may be an inkjet-printable material.

According to an embodiment, a thickness t1 of each of the inorganic layers 251 and 253 may be less than or equal to about 5 μm, whereas a thickness t2 of the lower organic layer 252 may be less than or equal to about 20 μm. If the thickness t1 of each of the inorganic layers 251 and 253 exceeds about 5 μm or the thickness t2 of the lower organic layer 252 exceeds about 20 μm, it may be difficult to reduce the thickness of the organic light-emitting display apparatus 2 and/or to manufacture the organic light-emitting display apparatus 2 as a flexible display apparatus.

Furthermore, the thickness t1 of each of the inorganic layers 251 and 253 may be greater than about 300 nm, whereas the thickness t2 of the lower organic layer 252 may be greater than about 1 μm. If the thickness t1 of each of the inorganic layers 251 and 253 is less than or equal to about 300 nm, it may be difficult to block permeation of moisture or oxygen to the organic light-emitting device OLED. If the thickness t2 of the lower organic layer 252 is less than or equal to about 1 μm, it may be difficult to uniformly disperse the quantum dots 252a having sizes from several nm to hundreds of nm.

The lower organic layer 252 including the quantum dots 252a may be inside the opening 260h in the pixel-defining layer 260. In other words, the lower organic layer 252 may be in an area defined by the pixel-defining layer 260.

Therefore, according to an embodiment, the lower organic layer 252 may be only in an area corresponding to the opening 260h, between the first inorganic layer 251 and the second inorganic layer 253. The second inorganic layer 253 may include a first area 253a that directly contacts the first inorganic layer 251 and a second area 253b that is disposed or spaced apart from the first inorganic layer 251 by the lower organic layer 252.

The first area 253a may correspond to an area in which the pixel-defining layer 260 is disposed, whereas the second area 253b may correspond to an area above the pixel electrode 220 exposed by the opening 260h in the pixel-defining layer 260.

The quantum dots 252a included in the lower organic layer 252 may absorb light of a certain wavelength and emit light of a wavelength longer than that of the absorbed light. According to an embodiment, the quantum dots 252a may be red quantum dots that emit red light, green quantum dots that emit green light, blue quantum dots that emit blue light, or yellow quantum dots that emit yellow light.

According to an embodiment, the organic light-emitting device OLED may emit blue light, and the quantum dots 252a included in the lower organic layer 252 of the encapsulating structure 250 may be yellow quantum dots that absorb blue light and emit yellow light or a combination of red quantum dots that absorb blue light and emit red light and green quantum dots that emit green light.

A part of blue light emitted by the organic light-emitting device OLED may not be absorbed by the encapsulating structure 250 and may be transmitted therethrough, whereas the other part of the blue light may be absorbed by the quantum dots 252a included in the encapsulating structure 250 and transformed to yellow light. As a result, the organic light-emitting display apparatus 2 may emit white light as a combination of the blue light and the yellow light.

However, the inventive concept is not limited thereto. The organic light-emitting device OLED included in the organic light-emitting display apparatus 2 may emit light of various colors, and the organic light-emitting display apparatus 2 including the organic light-emitting device OLED and the encapsulating structure 250 may emit light of various colors other than white light, such as red light, green light, blue light, and yellow light.

FIGS. 3A through 3G are sectional diagrams showing (e.g., sequentially showing) a method of manufacturing the organic light-emitting display apparatus 2 of FIG. 2, according to an embodiment.

A method of manufacturing an organic light-emitting display apparatus according to an embodiment includes formation of the pixel electrode 220 over the substrate 210, formation of the pixel-defining layer 260, which includes the opening 260h exposing at least a portion of the pixel electrode 220, over the pixel electrode 220, formation of the intermediate layer 230 including the organic emission layer over the portion of the pixel electrode 220 exposed by the opening 260h, formation of the counter electrode 240 over the intermediate layer 230, and formation of the encapsulating structure 250, which includes the at least one inorganic layer 251, 253 and the at least one organic layer 252 including the quantum dots 252a and disposed inside the opening 260h, over the counter electrode 240.

Figure 3A:
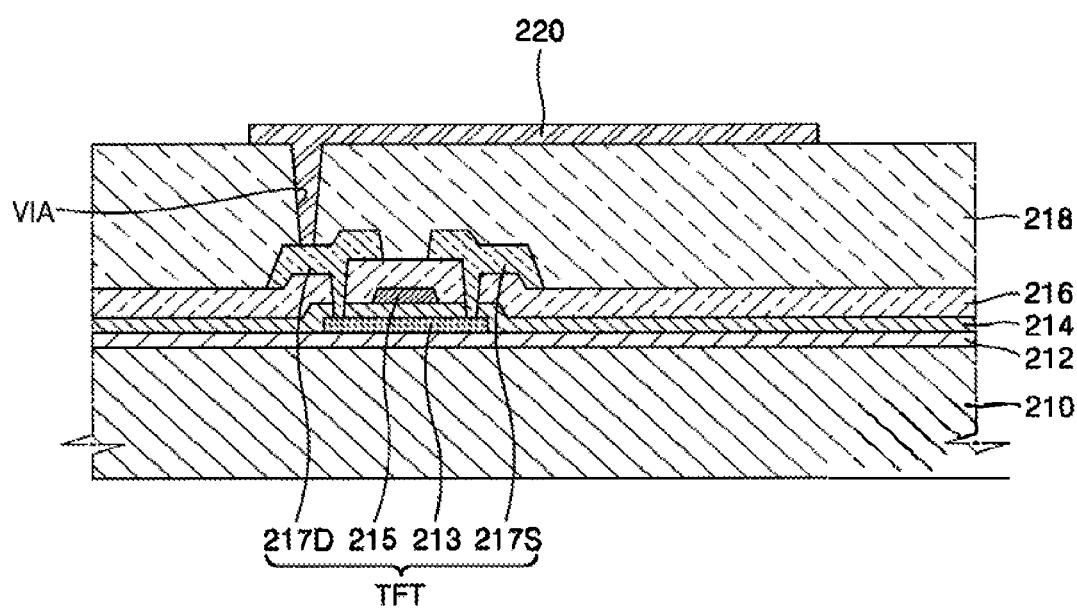
FIGS. 3A through 3G are sectional diagrams showing a method of manufacturing the organic light-emitting display apparatus of FIG. 2, according to an embodiment.

Referring to FIG. 3A, after the pixel circuit including a switching device, such as the TFT, is formed over the substrate 210, the pixel electrode 220 electrically connected to the pixel circuit is formed.

The pixel electrode 220 may be a reflective electrode including a reflective layer. According to an embodiment, the reflective layer may include at least one selected from silver (Ag), magnesium (Mg), aluminum (Al), platinum (Pt), palladium (Pd), gold (Au), nickel (Ni), neodymium (Nd), iridium (Ir), and chromium (Cr), where a transparent or semi-transparent electrode layer including at least one selected from a group consisting of indium tin oxide (ITO), indium zinc oxide (IZO), zinc oxide (ZnO), indium oxide ($In_2O_3$), indium gallium oxide (IGO), and aluminum zinc oxide (AZO) may be further disposed over the reflective layer. For example, the pixel electrode 220 may include three layers of ITO/Ag/ITO.

The pixel electrode 220 may be formed as an island-like structure by forming the metal and the conductive oxide over the substrate 210 and patterning the same.

Figure 3B:
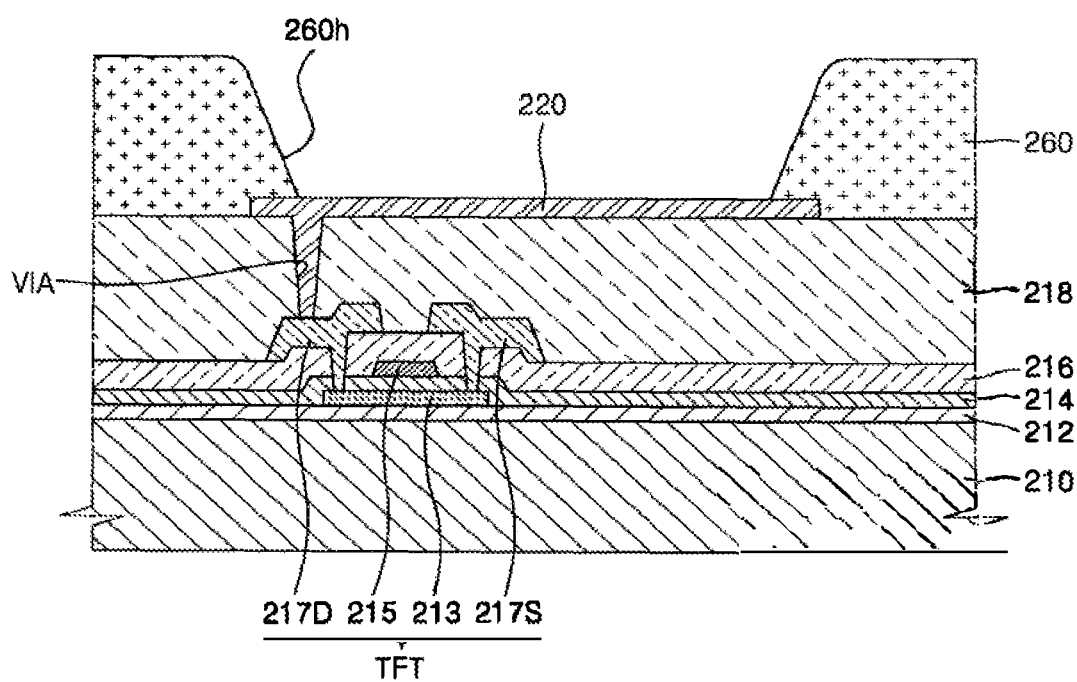

Referring to FIG. 3B, the pixel-defining layer 260 including the opening 260h that exposes at least a portion of the pixel electrode 220 may be formed over the pixel electrode 220.

The pixel-defining layer 260 may include an organic material, such as polyimide (PI), where the pixel-defining layer 260 including the opening 260h that exposes a portion of the pixel electrode 220 may be formed by forming an organic material over the substrate 210 to cover the pixel electrode 220 and patterning the same.

The portion exposed by the opening 260h may be the center area of the pixel electrode 220, whereas the portion covered by the pixel-defining layer 260 may be the edge area of the pixel electrode 220.

Figure 3C:
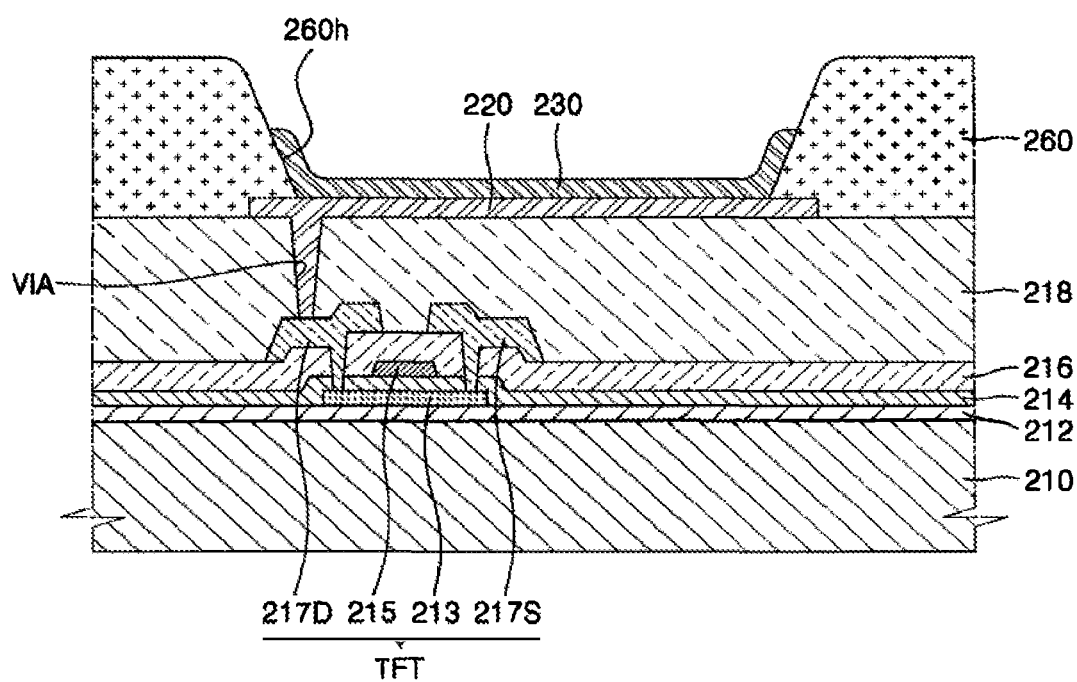

Referring to FIG. 3C, the intermediate layer 230 including the organic emission layer may be formed over the portion of the pixel electrode 220 exposed by the opening 260h in the pixel-defining layer 260. The intermediate layer 230 includes the organic emission layer and may further include at least one of a hole injection layer (HIL), a hole transport layer (HTL), an electron transport layer (ETL), and an electron injection layer (EIL). Although not shown, the HIL, the HTL, the ETL, and the EIL may not only be disposed inside the opening 260h, but also extend onto the top of the pixel-defining layer 260.

The organic emission layer may emit red light, green light, blue light, or white light.

Figure 3D:
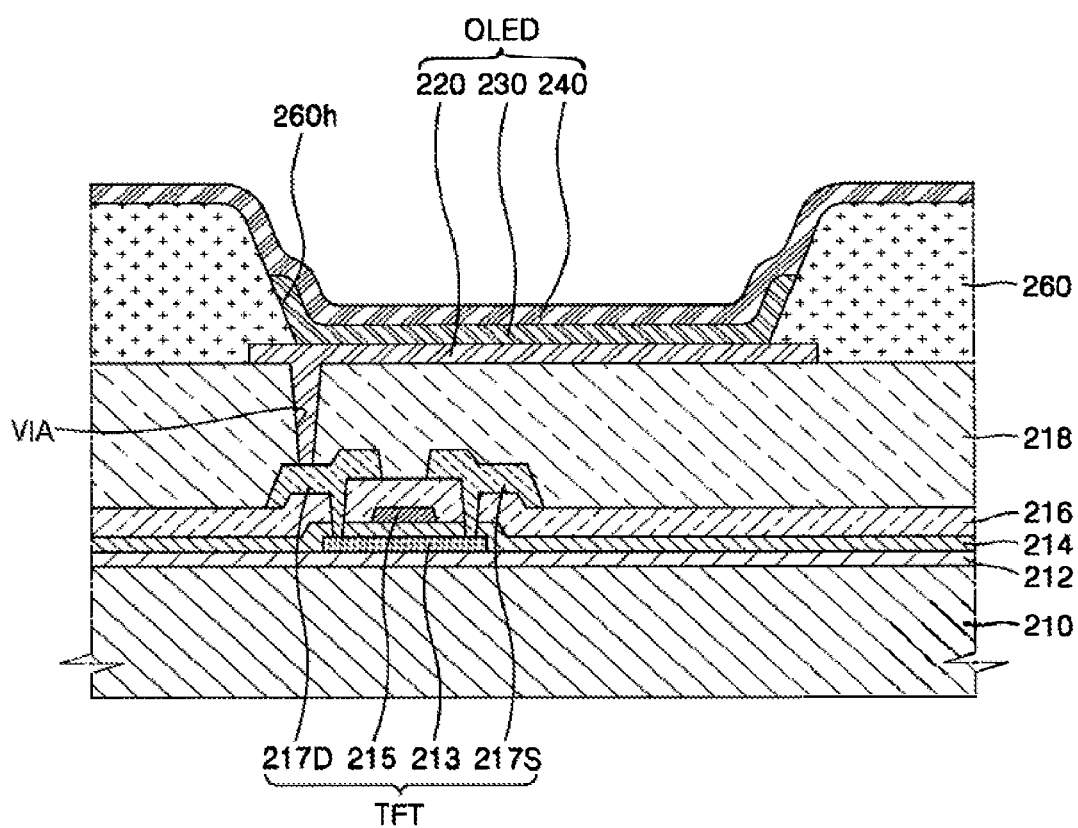

Referring to FIG. 3D, the counter electrode 240 may be formed over the intermediate layer 230. The counter electrode 240 may be disposed over the intermediate layer 230 and the pixel-defining layer 260. The counter electrode 240 may be a transparent or semi-transparent electrode. According to an embodiment, the counter electrode 240 may include one or more materials selected from among silver (Ag), aluminum (Al), ytterbium (Yb), titanium (Ti), magnesium (Mg), nickel (Ni), lithium (Li), calcium (Ca), copper (Cu), LiF/Ga, LiF/Al, MgAg, and CaAg, where the counter electrode 240 may include a thin film having a thickness from several nm to dozens of nm by using one or more of the above-stated materials to transmit light therethrough.

Figure 3E:
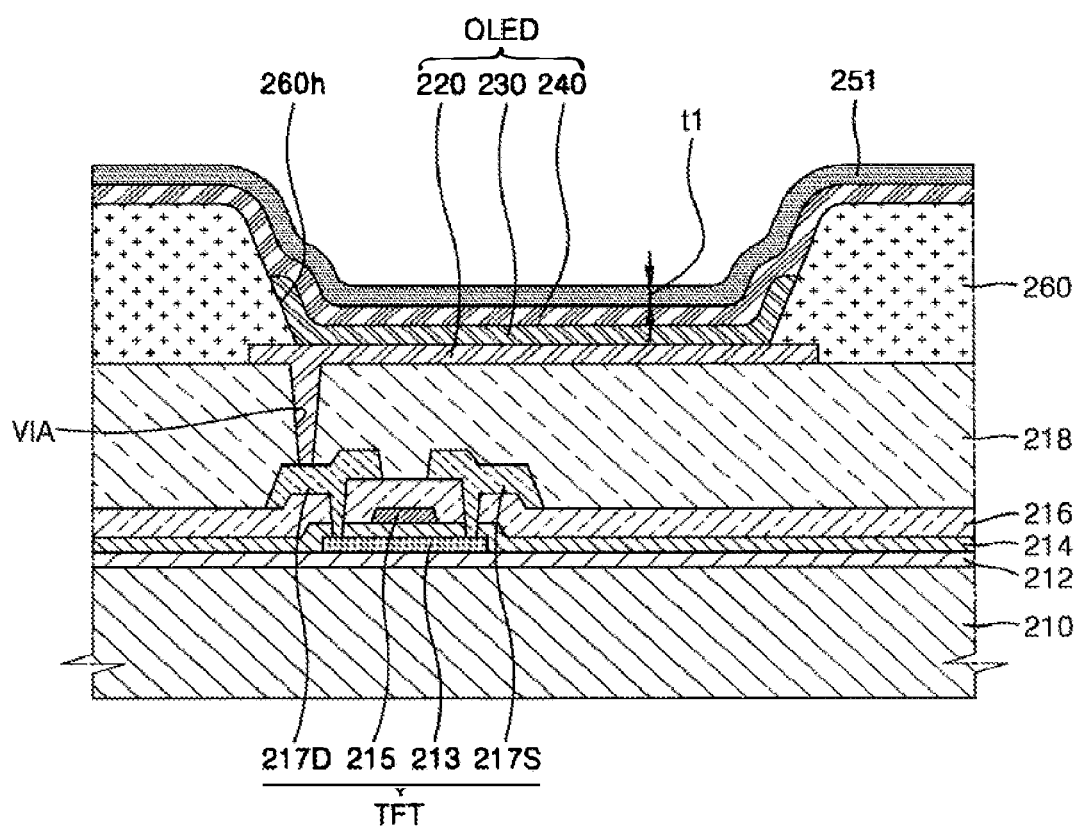

Referring to FIG. 3E, the first inorganic layer 251 may be formed over the counter electrode 240. The first inorganic layer 251 may include silicon nitride ($SiN_x$), silicon oxide ($SiO_2$), silicon oxynitride ($SiO_xN_y$) or aluminum oxide ($Al_2O_3$) and may be formed by using a sputtering method or a chemical vapor deposition (CVD) method, for example.

The thickness t1 of the first inorganic layer 251 may be less than or equal to about 5 μm.

Figure 3F:
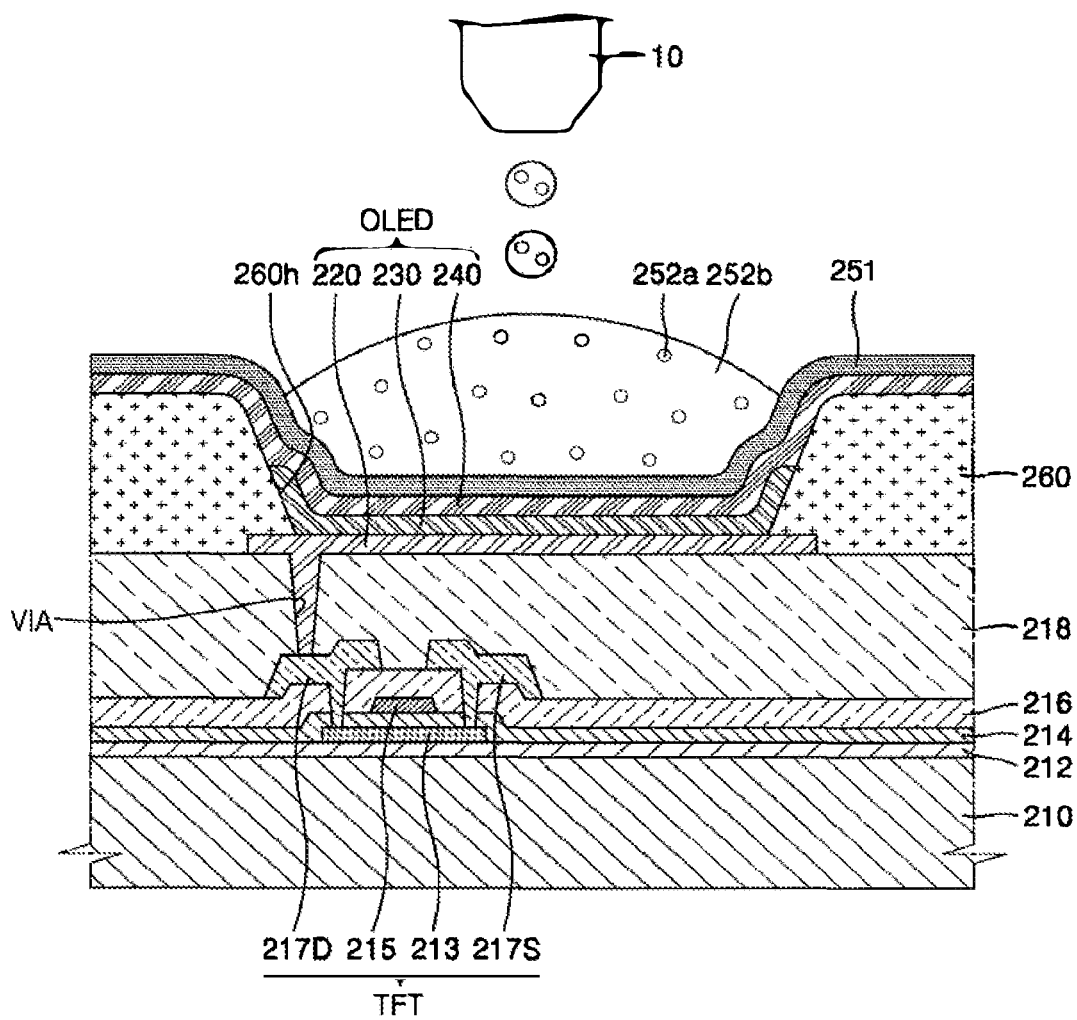

Referring to FIG. 3F, the organic material 252b having dispersed therein the quantum dots 252a may be formed inside the opening 260h of the pixel-defining layer 260 over the first inorganic layer 251 via inkjet-printing, for example. The organic material 252b may include any of various organic materials, such as epoxy-based resins, acryl-based resins, or polyimide-based resins.

By ejecting the organic material 252b having dispersed therein the quantum dots 252a from a nozzle 10 included in an inkjet printing apparatus, the organic material 252b may be dropped into an area defined by the pixel-defining layer 260 that functions as a barrier.

Figure 3G:
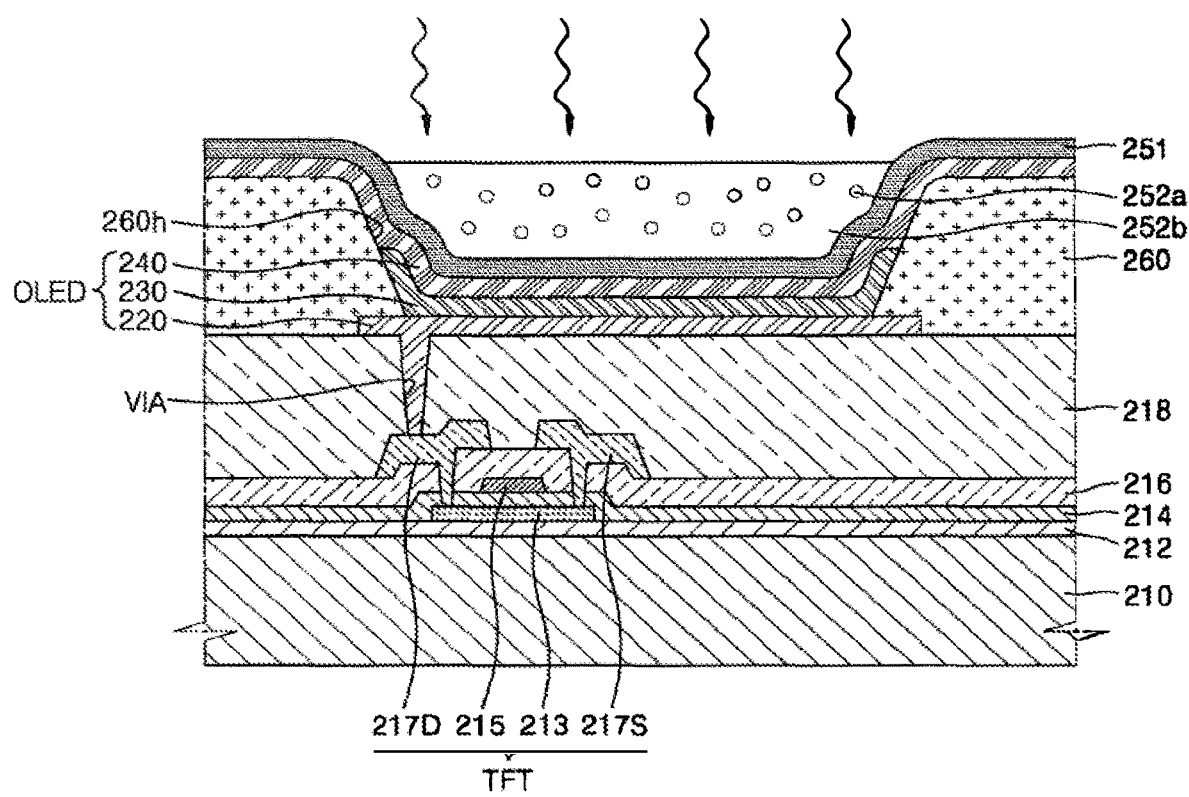

Referring to FIG. 3G, the lower organic layer 252 including the quantum dots 252a may be formed by coating the organic material 252b having dispersed therein the quantum dots 252a over the top surface of the portion of the first inorganic layer 251 inside the opening 260h and curing the same. The thickness t2 of the lower organic layer 252 may be less than or equal to about 20 μm.

Referring back to FIG. 2, by forming the second inorganic layer 253 over the lower organic layer 252, the encapsulating structure 250 including the first inorganic layer 251, the lower organic layer 252, and the second inorganic layer 253 may be formed. The second inorganic layer 253 may include the first area 253a that directly contacts the first inorganic layer 251 and the second area 253b that is disposed or spaced apart from the first inorganic layer 251 by the lower organic layer 252.

Although not shown, a function layer that enhances characteristics emitted by the organic light-emitting device OLED may be further formed before the first inorganic layer 251 is formed.

According to the organic light-emitting display apparatus 2 and the method of manufacturing the same as described above, the organic layer 252 including the quantum dots 252a may be simply formed inside the opening 260h in the pixel-defining layer 260 to enhance color purity of the organic light-emitting display apparatus 2, and the lower organic layer 252, which is a part of the encapsulating structure 250, may prevent or substantially prevent permeation of moisture or oxygen to the organic light-emitting device OLED, together with the inorganic layers 251 and 253.

Color purity of the organic light-emitting display apparatus 2 may be enhanced by introducing the quantum dots 252a to the encapsulating structure 250 without adding a separate layer, and thus the organic light-emitting display apparatus 2 may be easily manufactured as a flexible display apparatus.

Figure 4:
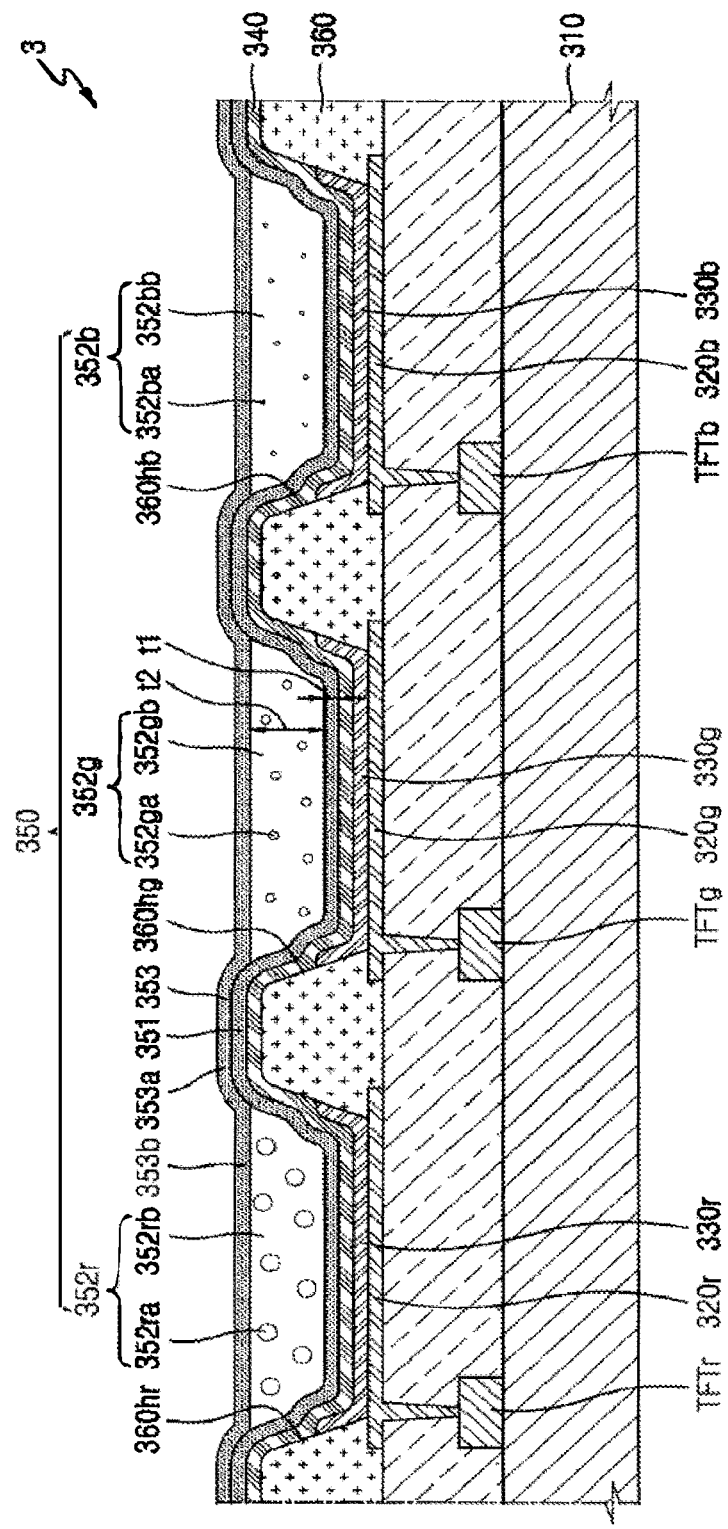
FIG. 4 is a schematic sectional view of an organic light-emitting display apparatus according to another embodiment.

FIG. 4 is a schematic sectional view of an organic light-emitting display apparatus 3 according to another embodiment. Descriptions below of the organic light-emitting display apparatus 3 according to another embodiment will focus on differences between the organic light-emitting display apparatus 3 of FIG. 4 and the organic light-emitting display apparatuses 1 and 2 previously described.

Referring to FIG. 4, the organic light-emitting display apparatus 3 according to another embodiment may include a substrate 310, pixel electrodes 320r, 320g, and 320b disposed over the substrate 310, a pixel-defining layer 360 including openings 360hr, 360hg, and 360hb that respectively expose at least portions of the pixel electrodes 320r, 320g, and 320b, intermediate layers 330r, 330g, and 330b that are disposed over respective portions of the pixel electrodes 320r, 320g, and 320b exposed by the openings 360hr, 360hg, and 360hb and include organic emission layers, a counter electrode 340 disposed over the intermediate layers 330r, 330g, and 330b, and an encapsulating structure 350 including at least one inorganic layer 351, 353 and at least one organic layer 352r, 352g, 352b, where the organic layers 352r, 352g, and 352b include quantum dots 352ra, 352ga, and 352ba and are disposed in the openings 360hr, 360hg, and 360hb, respectively.

The organic light-emitting display apparatus 3 according to an embodiment may include a plurality of pixels adjacent to one another, where the plurality of pixels may emit light of different colors. Each of the plurality of pixels may include the pixel electrodes 320r, 320g, and 320b and the intermediate layers 330r, 330g, and 330b.

The pixel electrodes 320r, 320g, and 320b may include a first pixel electrode 320r, a second pixel electrode 320g, and a third pixel electrode 320b that are apart from one another, and the pixel-defining layer 360 may include a first opening 360*hr*, a second opening 360*hg*, and a third opening 360*hb* that expose the first pixel electrode 320*r*, the second pixel electrode 320*g*, and the third pixel electrode 320*b*, respectively.

The intermediate layers 330*r*, 330*g*, and 330*b* may include a first intermediate layer 330*r* disposed over the first pixel electrode 320*r*, a second intermediate layer 330*g* disposed over the second pixel electrode 320*g*, and a third intermediate layer 330*b* disposed over the third pixel electrode 320*b*. The counter electrode 340 may be disposed over the intermediate layers 330*r*, 330*g*, and 330*b*.

A pixel circuit that drives the plurality of pixels may be between the substrate 310 and the pixel electrodes 320*r*, 320*g*, and 320*b*. The pixel circuit may include a first thin-film transistor TFTr, a second thin-film transistor TFTg, and a third thin-film transistor TFTb that are electrically connected to the first pixel electrode 320*r*, the second pixel electrode 320*g*, and the third pixel electrode 320*b*, respectively. Each of the plurality of pixels may be turned on or off by the pixel circuit.

According to an embodiment, the pixel electrodes 320*r*, 320*g*, and 320*b* may be reflective electrodes, the counter electrode 340 may be a transparent or semi-transparent electrode, and light emitted by organic emission layers included in the intermediate layers 330*r*, 330*g*, and 330*b* may be transmitted through the counter electrode 340 and emitted from the organic light-emitting display apparatus 3. In other words, the organic light-emitting display apparatus 3 may be a top-emission type display apparatus.

Each of the intermediate layers 330*r*, 330*g*, and 330*b* includes an organic emission layer and may further include a hole injection layer, a hole transport layer, an electron transport layer, and/or an electron injection layer. The first intermediate layer 330*r*, the second intermediate layer 330*g*, and the third intermediate layer 330*b* may include a first organic emission layer, a second organic emission layer, and a third organic emission layer, respectively, where a hole injection layer, a hole transport layer, an electron transport layer, and/or an electron injection layer may be included in each of the first intermediate layer 330*r*, the second intermediate layer 330*g*, and the third intermediate layer 330*b*.

According to an embodiment, the first intermediate layer 330*r*, the second intermediate layer 330*g*, and the third intermediate layer 330*b* may emit red light, green light, and blue light, respectively. According to another embodiment, all of the first intermediate layer 330*r*, the second intermediate layer 330*g*, and the third intermediate layer 330*b* may emit white light. If all of the first intermediate layer 330*r*, the second intermediate layer 330*g*, and the third intermediate layer 330*b* emit white light, the first intermediate layer 330*r*, the second intermediate layer 330*g*, and the third intermediate layer 330*b* may have a same structure in which different types of organic emission layers are stacked or may include layers including a combination of different organic materials.

The encapsulating structure 350 may be disposed over the counter electrode 340, where the encapsulating structure 350 may include the at least one inorganic layer 351, 353 and the at least one organic layer 352*r*, 352*g*, 352*b*. According to an embodiment, the encapsulating structure 350 may include a first inorganic layer 351 disposed over the counter electrode 340, the organic layers 352*r*, 352*g*, and 352*b*, which are disposed over the first inorganic layer 351 and respectively includes the quantum dots 352*ra*, 352*ga*, and 352*ba*, and a second inorganic layer 353 disposed over the organic layers 352*r*, 352*g*, and 352*b*.

According to an embodiment, the inorganic layers 351 and 353 may include silicon nitride ($SiN_x$), silicon oxide ($SiO_2$), silicon oxynitride ($SiO_xN_y$) or aluminum oxide ($Al_2O_3$) and may block or reduce permeation of impurities, such as moisture or oxygen, to the organic light-emitting device OLED.

The organic layers 352*r*, 352*g*, and 352*b* may include organic materials 352*rb*, 352*gb*, and 352*bb* and the quantum dots 352*ra*, 352*ga*, and 352*ba* that are respectively dispersed in the organic materials 352*rb*, 352*gb*, and 352*bb*. The organic layers 352*r*, 352*g*, and 352*b* may be used together with the inorganic layers 351 and 353 to improve sealing characteristics of the encapsulating structure 350 and to planarize rough surfaces therebelow. The organic materials 352*rb*, 352*gb*, and 352*bb* may include any of various organic materials, such as epoxy-based resins, acryl-based resins, or polyimide-based resins, and may be inkjet-printable materials.

According to an embodiment, a thickness t1 of each of the inorganic layers 351 and 353 may be less than or equal to about 5 µm, whereas a thickness t2 of each of the organic layers 352*r*, 352*g*, and 352*b* may be less than or equal to about 20 µm. If the thickness t1 of each of the inorganic layers 351 and 353 exceeds about 5 µm or the thickness t2 of each of the organic layers 352*r*, 352*g*, and 352*b* exceeds about 20 µm, it may be difficult to reduce the thickness of the organic light-emitting display apparatus 3 and/or to manufacture the organic light-emitting display apparatus 3 as a flexible display apparatus.

Furthermore, the thickness t1 of each of the inorganic layers 351 and 353 may be greater than about 300 nm, whereas the thickness t2 of each of the organic layers 352*r*, 352*g*, and 352*b* may be greater than about 1 µm. If the thickness t1 of each of the inorganic layers 351 and 353 is less than or equal to about 300 nm, it may be difficult to block permeation of moisture or oxygen to the organic light-emitting device OLED. If the thickness t2 of each of the organic layers 352*r*, 352*g*, and 352*b* is less than or equal to about 1 µm, it may be difficult to uniformly disperse the quantum dots 352*ra*, 352*ga*, and 352*ba* having sizes from several nm to hundreds of nm.

The organic layers 352*r*, 352*g*, and 352*b* including the quantum dots 352*ra*, 352*ga*, and 352*ba* may be inside the openings 360*hr*, 360*hg*, and 360*hb* included in the pixel-defining layer 360. In other words, the organic layers 352*r*, 352*g*, and 352*b* may be in an area defined by the pixel-defining layer 360.

The organic layers 352*r*, 352*g*, and 352*b* may include a first organic layer 352*r* that is disposed inside the first opening 360*hr* and includes first quantum dots 352*ra*, a second organic layer 352*g* that is disposed inside the second opening 360*hg* and includes second quantum dots 352*ga*, and a third organic layer 352*b* that is disposed inside the third opening 360*hb* and includes third quantum dots 352*ba*. The first organic layer 352*r*, the second organic layer 352*g*, and the third organic layer 352*b* may be separated from each other by the pixel-defining layer 360. The first quantum dots 352*ra*, the second quantum dots 352*ga*, and the third quantum dots 352*ba* may be disposed on a path in which light is transmitted through the counter electrode 340.

The first quantum dots 352*ra*, the second quantum dots 352*ga*, and the third quantum dots 352*ba* may be red quantum dots, green quantum dots, and blue quantum dots, respectively. The red quantum dots, the green quantum dots, and the blue quantum dots refer to quantum dots that absorb light of a certain wavelength and emit light of a wavelength corresponding to red, light of a wavelength corresponding to green, and light of a wavelength corresponding to blue, respectively.

According to an embodiment, the first intermediate layer 330r, the second intermediate layer 330g, and the third intermediate layer 330b may respectively emit red light, green light, and blue light having a certain FWHM, where the first quantum dots 352ra, the second quantum dots 352ga, and the third quantum dots 352ba may at least partially absorb the red light, the green light, and the blue light respectively emitted by the first intermediate layer 330r, the second intermediate layer 330g, and the third intermediate layer 330b and emit red light, green light, and blue light having a relatively small FWHM.

In other words, a FWHM of light transmitted through the first organic layer 352r, the second organic layer 352g, and the third organic layer 352b may be less than a FWHM of light emitted by the first intermediate layer 330r, the second intermediate layer 330g, and the third intermediate layer 330b. Accordingly, color purity of the organic light-emitting display apparatus 3 may be enhanced.

According to another embodiment, the first intermediate layer 330r, the second intermediate layer 330g, and the third intermediate layer 330b may emit white light, and the first quantum dots 352ra, the second quantum dots 352ga, and the third quantum dots 352ba may at least partially absorb the white light emitted by the first intermediate layer 330r, the second intermediate layer 330g, and the third intermediate layer 330b and emit red light, green light, and blue light having a small FWHM.

The organic layers 352r, 352g, and 352b may be only in areas corresponding to the openings 360hr, 360hg, and 360hb between the first inorganic layer 351 and the second inorganic layer 353. Therefore, the second inorganic layer 353 may include a first area 353a that directly contacts the first inorganic layer 351 and a second area 353b that is disposed or spaced apart from the first inorganic layer 351 by the organic layers 352r, 352g, and 352b.

The first area 353a may correspond to an area in which the pixel-defining layer 360 is disposed, whereas the second area 353b may correspond to areas above the pixel electrodes 320r, 320g, and 320b respectively exposed by the openings 360hr, 360hg, and 360hb included in the pixel-defining layer 360.

According to embodiments of the inventive concept, by disposing an encapsulating structure including an organic layer having dispersed therein quantum dots, an organic light-emitting display apparatus with enhanced color purity that may be easily manufactured as a flexible display apparatus, and a method of manufacturing the same may be provided.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:
1. A light-emitting display apparatus comprising:
a substrate;
a first pixel electrode and a second pixel electrode over the substrate, the first and second pixel electrodes being apart from each other;
a pixel-defining layer comprising a first opening and a second opening that expose portions of the first and second pixel electrodes, respectively;
an intermediate layer comprising at least an emission layer and arranged over the first and second pixel electrodes;
a counter electrode covering the intermediate layer;
a continuous first inorganic layer covering the first opening, the second opening and the counter electrode
a first organic layer on the first inorganic layer, the first organic layer comprising first quantum dots and overlapping the first opening; and
a second organic layer on the first inorganic layer, the second organic layer comprising second quantum dots and overlapping the second opening,
wherein
the first organic layer and the second organic layer are apart from each other,
a total thickness of the first inorganic layer and the first organic layer in an area overlapping the first opening is greater than a total thickness of the first inorganic layer and the first organic layer over the pixel-defining layer, and
a total thickness of the first inorganic layer and the second organic layer in an area overlapping the second opening is greater than a total thickness of the first inorganic layer and the second organic layer over the pixel-defining layer.

2. The light-emitting display apparatus of claim 1, further comprising a second inorganic layer on the first and second organic layers.

3. The light-emitting display apparatus of claim 2, wherein the second inorganic layer covers the first and second openings and the pixel-defining layer.

4. The light-emitting display apparatus of claim 2, wherein the first and second inorganic layers comprise at least one of silicon nitride ($SiN_x$), silicon oxide ($SiO_2$), silicon oxynitride ($SiO_xN_y$), or aluminum oxide ($Al_2O_3$).

5. The light-emitting display apparatus of claim 1, wherein
each of the first and second pixel electrodes comprises a reflective electrode that reflects light, and
the counter electrode comprises a transparent or semi-transparent electrode that at least partially transmits light therethrough.

6. The light-emitting display apparatus of claim 1, wherein a thickness of each of the first and second organic layers is less than or equal to about 20 μm.

7. The light-emitting display apparatus of claim 1, further comprising:
a third pixel electrode over the substrate, the third pixel electrode being apart from the first and second pixel electrodes; and
a third organic layer on the first inorganic layer, the third organic layer comprising third quantum dots and overlapping a third opening, wherein the third opening is defined in the pixel-defining layer and exposes a portion of the third pixel electrode.

8. The light-emitting display apparatus of claim 7, wherein
the third organic layer is apart from the first and second organic layers.

9. The light-emitting display apparatus of claim 7, wherein a total thickness of the first inorganic layer and the third organic layer in an area overlapping the third opening is greater than a total thickness of the first inorganic layer and the third organic layer over the pixel-defining layer.

10. The light-emitting display apparatus of claim 7, wherein the third pixel electrode comprises a reflective electrode that reflects light.

11. The light-emitting display apparatus of claim 7, wherein the emission layer emits white light.

12. The light-emitting display apparatus of claim 11, wherein the first, second, and third quantum dots comprise red quantum dots, green quantum dots, and blue quantum dots, respectively.

13. The light-emitting display apparatus of claim 11, wherein a full width at half maximum (FWHM) of light transmitted through the first organic layer, the second organic layer, and the third organic layer is less than a FWHM of light emitted by the emission layer, respectively.

14. A light-emitting display apparatus comprising:
a substrate;
first, second, and third pixel electrodes over the substrate, the first, second, and third pixel electrodes being apart from each other;
a pixel-defining layer comprising first, second, and third openings that expose portions of the first, second, and third pixel electrodes, respectively;
an intermediate layer comprising at least an emission layer and arranged over the first, second, and third pixel electrodes;
a counter electrode covering the intermediate layer;
a continuous first inorganic layer covering the first opening, the second opening and the counter electrode
a first organic layer on the first inorganic layer, the first organic layer comprising first quantum dots and overlapping the first opening;
a second organic layer on the first inorganic layer, the second organic layer comprising second quantum dots and overlapping the second opening;
a third organic layer on the first inorganic layer, the third organic layer comprising third quantum dots and overlapping the third opening; and
a second inorganic layer on the first and second organic layers,
wherein
the first, second, and third organic layers are apart from each other.

15. The light-emitting display apparatus of claim 14, wherein the first and second inorganic layers comprise at least one of silicon nitride ($SiN_x$), silicon oxide ($SiO_2$), silicon oxynitride ($SiO_xN_y$), or aluminum oxide ($Al_2O_3$).

16. The light-emitting display apparatus of claim 14, wherein the emission layer emits white light.

17. The light-emitting display apparatus of claim 14, wherein the first, second, and third quantum dots comprise red quantum dots, green quantum dots, and blue quantum dots, respectively.

18. A light-emitting display apparatus comprising:
a substrate;
a light-emitting device over the substrate and comprising a first electrode, a second electrode, and an emission layer between the first electrode and the second electrode;
a first inorganic layer over the light-emitting device;
a first organic layer on the first inorganic layer and comprising first quantum dots;
a second organic layer on the first inorganic layer and comprising second quantum dots;
a third organic layer on the first inorganic layer and comprising third quantum dots; a second inorganic layer on the first, second, and third organic layers, wherein the first, second, and third organic layers are apart from each other,
a thickness of each of the first, second, and third organic layers is greater than a thickness of each of the first and second inorganic layers; and
wherein the first inorganic layer extends continuously to overlap with the first organic layer, the second organic layer and the third organic layer.

19. The light-emitting display apparatus of claim 18, wherein the emission layer emits white light.

20. The light-emitting display apparatus of claim 18, wherein the first, second, and third quantum dots comprise red quantum dots, green quantum dots, and blue quantum dots, respectively.

* * * * *